United States Patent [19]
Nakamura

[11] Patent Number: 6,064,080
[45] Date of Patent: May 16, 2000

[54] SEMICONDUCTOR DEVICE

[75] Inventor: Hideki Nakamura, Hyogo, Japan

[73] Assignee: Mitsubishi Denki Kabushiki Kaisha, Tokyo, Japan

[21] Appl. No.: 09/061,150

[22] Filed: Apr. 16, 1998

[30] Foreign Application Priority Data

Oct. 27, 1997 [JP] Japan .................................. 9-294005

[51] Int. Cl.$^7$ .......................... H01L 29/74; H01L 31/111
[52] U.S. Cl. .......................................... 257/119; 107/124
[58] Field of Search ................................ 257/107, 119, 257/124

[56] References Cited

U.S. PATENT DOCUMENTS

| | | |
|---|---|---|
| 3,333,182 | 7/1967 | Biet et al. . |
| 3,440,438 | 4/1969 | Bull . |
| 4,794,441 | 12/1988 | Sugawara et al. . |
| 5,369,291 | 11/1994 | Swanson . |

FOREIGN PATENT DOCUMENTS 7-93434  10/1995  Japan .

OTHER PUBLICATIONS

"600V Trench IGBT in Comparison with Planar IGBT: An Evaluation of the Limit of IGBT Performance", M. Harada et al., Proceedings of the 6th International Symposium on Power Semiconductor Devices & ICs, pp. 411–416.

"A 4500V Injection Enhanced Insulated Gate Bipolar Transistor (IEGT) Operating in a Mode Similar to a Thyristor", M. Kitagawa et al., International Electron Devices meeting 1993, pp. 679–682.

Primary Examiner—Stephen D. Meier
Attorney, Agent, or Firm—McDermott, Will & Emery

[57] ABSTRACT

A direct-current power supply unit is provided for applying forward bias to a pn junction between an n emitter region and a p base region. A switch is provided between the direct-current power supply unit and a first metal electrode layer or a second metal electrode layer. A switch control circuit is connected to the switch. A gate control circuit is connected to the switch control circuit. Accordingly, ON voltage of an IGBT can be reduced while latch-up is avoided.

10 Claims, 13 Drawing Sheets

SEMICONDUCTOR DEVICE

BACKGROUND OF THE INVENTION

1. Field of the Invention

The present invention relates to a semiconductor device, particularly to an Insulated Gate Bipolar Transistor (hereinafter referred to simply as "IGBT") having a configuration in which current flows between both major surfaces of a semiconductor substrate.

2. Description of the Background Art

The IGBT is generally used widely as an element for controlling a motor, for switching of an inverter or the like. The IGBT is a voltage drive element having both properties of low saturation voltage of the bipolar transistor and high-speed switching of the MOSFET, and characterized by small losses in driving power and ON/OFF switching. Since the configuration of the device permits miniaturization of the MOSFET formed on a chip and a decreased ON voltage by an enhanced integration, the use thereof is spreading in these years.

A vertical type n channel IGBT having a planar gate structure is herein presented as one example of conventional IGBTs, and the configuration thereof is described. FIG. 21 shows a cross section of an n channel IGBT having a conventional planar gate structure.

Referring to FIG. 21, an n drift region 1 is formed on the side of a first major surface 14a of a semiconductor substrate 14, and a p base region 2 is selectively formed in n drift region 1. An n emitter region 3 is selectively formed in p base region 2. A region 4 sandwiched between n drift region 1 and n emitter region 3, located in p base region 2, and extending to reach the first major surface 14a is referred to as a channel formation region. A gate dielectric layer 5 is formed on the first major surface 14a to cover channel formation region 4. Gate dielectric layer 5 extends from a portion above n emitter region 3 onto n drift region 1.

P base region 2 and n emitter region 3 are short-circuited by a metal electrode layer (emitter electrode) 8. P base region 2 and metal electrode layer 8 as well as n emitter region 3 and metal electrode layer 8 are in ohmic contact with each other. Further, a p collector region 10 is formed on the side of a second major surface 14b of semiconductor substrate 14. A metal electrode layer (collector electrode) 11 is formed on the second major surface 14b to be in ohmic contact with p collector region 10.

Principles of an operation of the n channel IGBT having the configuration above are described below. Descriptions of following four processes, specifically a process of transition from a cut-off (OFF) state to a conduction (ON) state, a steady state, a process of transition from the ON state to the OFF state, and the OFF state are respectively given below.

(1) Process of Transition from OFF State to ON State

Positive (+) voltage is applied to a gate electrode 6 while voltage which is relatively positive to the voltage at emitter electrode 8 is applied to collector electrode 11. Accordingly, a channel inverted to become n type is formed at channel formation region 4 located in p base region 2. Through this n channel, the electron as one of the carriers is injected from n emitter region 3 into n drift region 1, and the electron flows toward p collector region 10. When the electron reaches p collector region 10, the hole as one of the carriers is injected from p collector region 10 into n drift region 1. The hole flows toward n emitter region 3 to which relatively negative voltage is applied, and the hole reaches a place where the n channel is in contact with n drift region 1. This process is referred to as a storage process, and the time required for this process is referred to as a turn-on delay time (td(on)). The loss of electric power in this process is extremely small and negligible.

Enough carriers are thereafter stored according to the potential difference applied between emitter electrode 8 and collector electrode 11, and a low-resistance state referred to as conductivity modulation due to pairs of electron-hole occurs. Accordingly, the turn-on operation completes. This process is called a rise process, and the time required for this process is called rise time (t(rise)). The loss of electric power in this process is relatively large.

(2) Steady State

The steady state after completion of the turn-on operation is called ON state, and the voltage when current of 100 A/cm$^2$ flows is called ON voltage. The power loss in this state is called ON loss or steady loss, and expressed by the product of forward voltage drop caused by a resistance component and conduction current. The power loss in ON state is generally exceedingly large. The resistance component in the ON state is determined by the sum of respective resistance components existing at the current path of the device or between emitter electrode 8 and collector electrode 11. The current path of the device is added to the cross sectional view of IGBT in FIG. 21 and shown in FIG. 22 together.

Referring to FIG. 22, references C, E and G in this figure respectively represent terminals of electrodes of the collector, emitter, and gate. Further, Ic, Ih, and Ie respectively represent collector current of IGBT, hole current flowing from n drift region 1 into p base region 2, and electron current flowing from n drift region 1 into n emitter region 3 through channel formation region 4. As shown in FIG. 22, the total resistance component R affecting the ON voltage can be expressed by the following equation.

$$R = Rcn + Rn + Rch + Ra + R_{JFET} + Rd + R_{diode} + Rs + Rcp$$

In the equation above, Rcn is contact resistance between n emitter region 3 and metal electrode layer 8, Rn is resistance of n emitter region 3, Rch is resistance of the channel, Ra is resistance of the storage layer, $R_{JFET}$ is a resistance component due to JFET (Junction-FIELD EFFECT TRANSISTOR) effect, Rd is resistance of n drift region 1, Rdiode is forward voltage drop of the diode between p collector region 10 and n drift region 1, Rs is resistance of p collector region 10, and Rcp is the contact resistance between p collector region 10 and metal electrode layer 11. There is no JFET in the IGBT having the trench gate structure.

(3) Process of Transition from ON State to OFF State

OFF state is caused by applying voltage of at most the threshold voltage such as negative (−) voltage to gate electrode 6. When the potential at gate electrode 6 is the threshold voltage or less, the n channel formed in ON state disappears. Accordingly, supply of electrons from n emitter region 3 to n drift region 1 is stopped. This process is referred to as a storage process, and the time required for this process is called storage time or turn-off delay time (td(off)). The power loss during this process is extremely small and negligible. Since the supply of electrons is stopped, the density of electrons gradually decreases from a region in the vicinity of n emitter region 3. As a result, the holes injected into n drift region 1 for maintaining an electrically neutral condition also begin to decrease.

Since p base region 2 and n drift region 1 are in a reverse bias state, a depletion layer begins to expand at an interface between p base region 2 and n drift region 1. The depletion layer has a thickness corresponding to a voltage applied between collector electrode 11 and emitter electrode 8. This process is called a fall process. The time required for this process is called fall time and the power loss during this process is called fall loss. The power loss during this period is equivalent to or larger than the turn-on loss and the steady state loss. Holes among carriers outside the depletion region described above pass through the depletion region, pass through a p+ contact region having high concentration in p base region 2 which is electrically short-circuited with n emitter region 3, and reach metal electrode layer 8. All of the carriers thus disappear and the turn-off completes. This process is called a tail process, the time required for this process is called tail time (t(tail)), and the power loss in this process is called tail loss. The power loss during this process is extremely large.

(4) OFF State

The steady state after completion of the turn-off is referred to as OFF state. Generally, the power loss expressed by the product of the leakage current in this state and the voltage between collector electrode 11 and emitter electrode 8 is extremely small compared with other power losses, and is negligible.

Various power losses are caused in respective processes of conduction/cut-off in the conventional IGBT as described above. In order to achieve a high performance of IGBT, reduction of any one of these losses is desired. In the conventional IGBT, since p base region 2 and n emitter region 3 have the same potential, the pn junction between n drift region 1 and p base region 2 has a low potential. Therefore, storage of carriers decreases to reduce the carrier concentration. As a result, the ON voltage of the IGBT increases, and the power loss in the ON state of the IGBT becomes large.

Further, the IGBT generally has a problem of the latch-up. Description of the latch-up is given referring to FIG. 23. FIG. 23 shows an equivalent circuit to the IGBT. Referring to FIG. 23, an npn bipolar transistor Tr1 is constituted of n emitter region 3, p base region 2, and n drift region 1. A pnp bipolar transistor Tr2 is constituted of p base region 2, n drift region 1 and p collector region 10.

The latch-up is caused, when the parasitic npn bipolar transistor Tr1 is turned on, by the positive feedback between the parasitic npn bipolar transistor Tr1 and the pnp bipolar transistor Tr2. When hole current Ih flows from n drift region 1 to p base region 2, n emitter region 3 and p base region 2 attains a forward bias state due to voltage drop generated by a resistance component $R_B$ in p base region 2. If the voltage drop exceeds the built-in voltage of the npn bipolar transistor (generally about 0.7 V in the case of a bipolar transistor formed on a silicon wafer), electrons are directly injected from n emitter region 3 to p base region 2, resulting in the latch-up. Once the latch-up occurs, the current flowing through the device (IGBT) cannot be controlled by voltage applied to the gate electrode, and the device could be destroyed. Therefore, such latch-up should be avoided.

SUMMARY OF THE INVENTION

The present invention is made to solve the problems above. One object of the present invention is to provide a semiconductor device which enables the latch-up to be avoided and the power loss in the ON state to be reduced by decreasing the ON voltage.

A semiconductor device according to the invention includes first and second major surfaces opposite to each other, and permits current flowing between the first and second major surfaces to be conducted/cut-off. The semiconductor device according to the invention includes: a semiconductor substrate; a first impurity region of a first conductivity type (e.g. n type); a second impurity region of a second conductivity type (e.g. p type); a third impurity region of the first conductivity type; a channel formation region; a gate dielectric layer; a gate electrode; first, second and third electrode layers; a forward bias unit; a forward bias control unit; and a fourth impurity region of the second conductivity type. The semiconductor substrate is provided with first and second major surfaces. The first impurity region is formed to extend from the first major surface into the semiconductor substrate. The second impurity region is selectively formed in the first impurity region. The third impurity region is selectively formed in the second impurity region. The channel formation region is located in the second impurity region and has a channel formed therein. The gate dielectric layer is formed along the channel formation region. The gate electrode is opposite to the channel formation region with the gate dielectric layer therebetween. The first electrode layer is formed on the first major surface to be electrically connected to the second impurity region. The second electrode layer is formed on the first major surface to be electrically connected to the third impurity region. The forward bias unit is provided for applying forward bias to a pn junction between the second and third impurity regions. The forward bias control unit connected to the forward bias unit is for controlling a value of voltage applied to the pn junction by the forward bias unit. The fourth impurity region is formed to extend from the second major surface into the semiconductor substrate. The third electrode layer is formed on the second major surface to be electrically connected to the fourth impurity region.

The semiconductor device according to the invention is provided with the forward bias unit and the forward bias control unit as described above. The forward bias unit enables the forward bias to be applied to the pn junction between the second and third impurity regions. Accordingly, the potential of the second impurity region can be increased and injection of electrons from the third impurity region to the second impurity region can be promoted. Increase of the potential of the pn junction between the first and second impurity regions is achieved by increasing the potential of the second impurity region. Accordingly, injection of holes from the fourth impurity region to the second impurity region through the first impurity region can be promoted. As a result, the carrier concentration in the first and second impurity regions can be increased. It leads to decrease of the resistance of the semiconductor device during conduction and decrease of the ON voltage of the semiconductor device. Further, control of the value of the voltage applied to the pn junction by the forward bias unit becomes possible by providing the forward bias control unit. For example, the voltage applied by the forward bias unit can be limited to be less than the value which may cause the latch-up. The latch-up caused if the forward bias is applied to the pn junction between the second and third impurity regions by the forward bias unit can be effectively avoided accordingly.

Preferably, the voltage applied to the pn junction between the second and third impurity regions by the forward bias unit is less than the built-in voltage of the pn junction. The latch-up can be more surely avoided accordingly.

The forward bias unit includes a direct-current power supply connected to the first and second electrode layers at the time of conduction of the semiconductor device. The forward bias control unit includes a switch provided between the forward bias unit and the first or the second electrode layer. The switch is opened or closed according to the value of the voltage applied to the gate electrode.

By employing the direct-current power supply as the forward bias unit, the voltage applied to the pn junction between the second and third impurity regions can be maintained at a value less than the built-in voltage. By providing the switch as described above between the forward bias unit and the first or second electrode layer, connection/non-connection between the forward bias unit and the first and second electrode layers can be controlled according to the value of the voltage applied to the gate electrode (gate potential). As a result, the forward bias unit is never connected to the pn junction between the second and third impurity regions when the semiconductor device is in the OFF state, and the latch-up can be more surely avoided.

A first voltage and a second voltage are applied to the gate electrode. The channel is formed by the application of the first voltage, and the channel disappears by the application of the second voltage. Preferably, the switch is closed in response to the application of the first voltage and forward bias is applied to the pn junction, and the switch is opened in response to the application of the second voltage and the application of forward bias is stopped. If the gate electrode is grounded, for example, 0 V is considered to be applied.

Application of the forward bias to the pn junction between the second and third impurity regions in the OFF state of the semiconductor device can be avoided by stopping the application of forward bias in response to the application of the second voltage. Accordingly, the latch-up can be still more surely avoided.

The switch is preferably a semiconductor switch. High-speed switching is achieved by employing such a semiconductor switch.

Preferably, the first and second electrode layers are formed of metal provided to be in ohmic contact with the surfaces of the second and third impurity regions respectively, and a dielectric layer is formed between the first and second electrode layers to extend from a portion above the first major surface.

The direct-current power supply can thus be used as forward bias unit by providing the dielectric layer between the first and second electrode layers. As a result, the voltage applied between the second and third impurity regions can be maintained at a value less than the built-in voltage as described above.

The forward bias unit includes a voltage drop unit provided between the first electrode layer and the second impurity region. The forward bias control unit includes a Zener diode connected in parallel with the forward bias unit.

By providing the Zener diode in parallel with the forward bias unit, the voltage applied to the pn junction as a result of voltage drop is effectively prevented from exceeding the built-in voltage of the pn junction. The latch-up caused if the voltage drop unit is employed as the forward bias unit can be effectively avoided. By providing the voltage drop unit between the first electrode layer and the second impurity region, voltage drop is caused when current flows through the voltage drop unit during conduction of the semiconductor device. Accordingly, the potential of the second impurity region can be increased to become higher than that of the third impurity region, and injection of electrons from the third impurity region to the second impurity region can be promoted. Further, injection of holes to the second impurity region can be promoted, and the carrier concentration in the first and second impurity regions can be increased. As a result, the resistance of the semiconductor device during conduction can be decreased, and the ON voltage of the semiconductor device can be decreased accordingly.

Preferably withstand voltage of the Zener diode above is 0.5 V or less. This withstand voltage enables the voltage applied to the pn junction due to voltage drop by the voltage drop unit above to be effectively prevented from exceeding the built-in voltage of the pn junction.

The voltage drop unit includes a resistive layer having its resistance value higher than the value of sheet resistance of the second impurity region. By employing such a resistive layer, voltage drop can be caused at the time of conduction, and the ON voltage of the semiconductor device can be decreased.

The voltage drop unit may be Schottky junction. By employing the Schottky junction, voltage drop can also be caused as in the case of the resistive layer above. Accordingly, the ON voltage of the semiconductor device can be decreased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are hereinafter described referring to FIGS. 1–20.

First Embodiment

Figure 1:
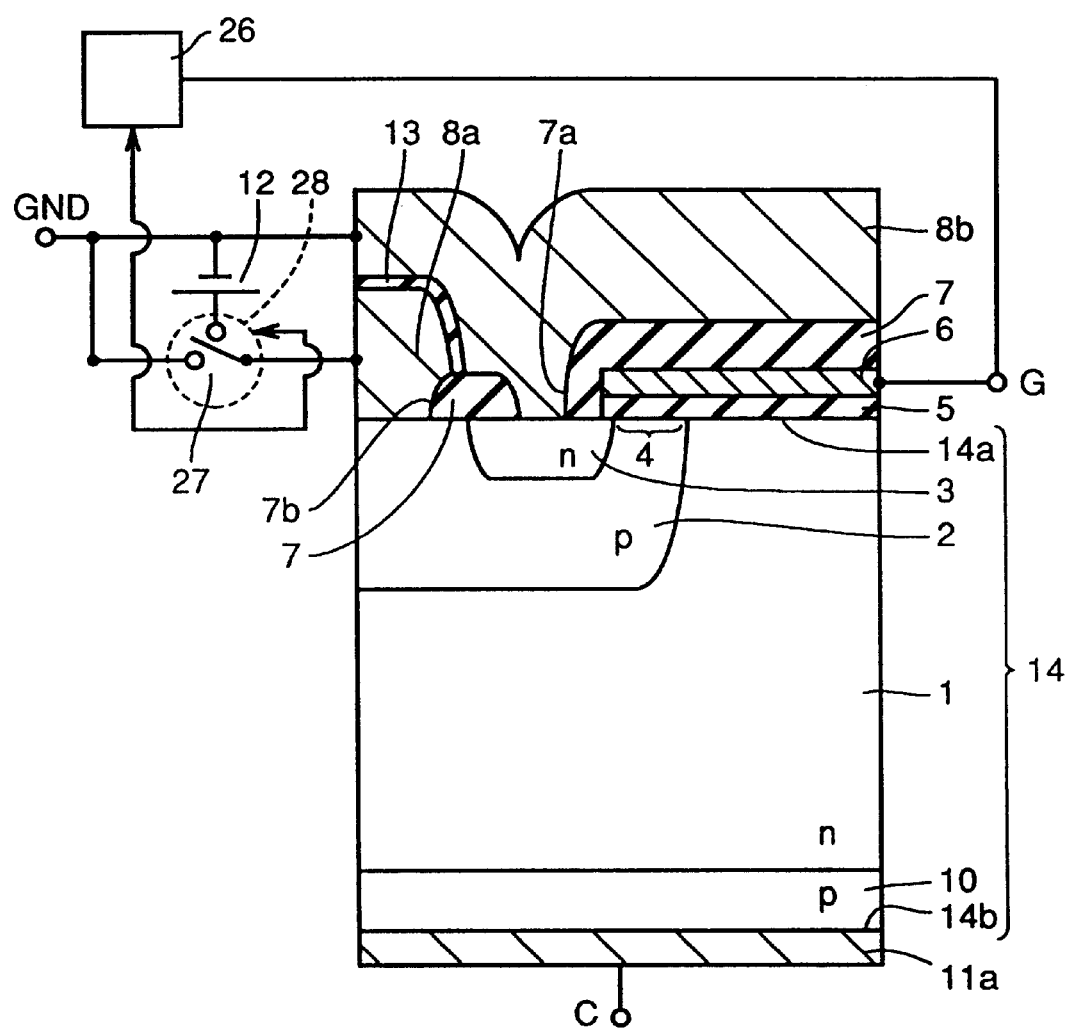
FIG. 1 shows a cross section of an IGBT according to the first embodiment of the present invention.

With reference to FIGS. 1–13, the first embodiment and its modification of the present invention are described. FIG. 1 is a cross sectional view showing an n channel IGBT having a planar gate structure according to the first embodiment of the invention.

Referring to FIG. 1, an n drift region 1 is formed on the side of a first major surface 14a of a semiconductor substrate 14. Semiconductor substrate 14 may be a substrate of an intrinsic semiconductor, and may be formed of a plurality of semiconductor layers. A p base region 2 is formed from the first major surface 14a of semiconductor substrate 14 to extend into n drift region 1. P base region 2 is selectively formed in n drift region 1. N drift region 1 has a portion which reaches the first major surface 14a.

An n emitter region 3 is formed from the first major surface 14a to extend into p base region 2. N emitter region 3 is also formed selectively in p base region 2. A region which is sandwiched between n drift region 1 and n emitter region 3, reaches the first major surface 14a in p base region 2, and has a channel formed therein is hereinafter referred to as a channel formation region 4.

A gate dielectric layer 5 is formed to cover the first major surface 14a over channel formation region 4 and to be in contact with both of n drift region 1 and n emitter region 3. Gate dielectric layer 5 is, for example, formed of dielectric such as silicon oxide. A p collector region 10 is formed from a second major surface 14b of semiconductor substrate 14 to extend into semiconductor substrate 14. A gate electrode 6 is formed on gate dielectric layer 5 such that it has a portion opposite to channel formation region 4 with gate dielectric layer 5 therebetween. Gate electrode 6 is formed of, for example, polysilicon doped with phosphorus.

A dielectric layer 7 is formed on the first major surface 14a to cover gate electrode 6. Dielectric layer 7 is provided with a contact hole 7a which exposes a part or the whole of the surface of n emitter region 3, and a contact hole 7b which exposes a part of p base region 2. A first metal electrode layer 8a is formed to extend from the inside of contact hole 7b onto dielectric layer 7. An interlayer dielectric layer 13 is formed to cover the first metal electrode layer 8a.

A second metal electrode layer 8b is formed to extend from the inside of contact hole 7a onto dielectric layer 7 and interlayer dielectric layer 13. The first metal electrode layer 8a is in ohmic contact with p base region 2, and the second metal electrode layer 8b is in ohmic contact with n emitter region 3. A third metal electrode layer 11a is formed on the second major surface 14b to be in ohmic contact with p collector region 10.

A direct-current power supply unit 12 which functions as forward bias means is provided in the configuration above such that the unit is electrically connected with the first and second metal electrode layers 8a and 8b via a switch 27. By closing switch 27, direct-current power supply unit 12 is electrically connected with the first and the second metal electrode layers 8a and 8b.

Accordingly, the positive side of direct-current power supply unit 12 is connected to the first metal electrode layer 8a, and the negative side thereof is connected to the second metal electrode layer 8b. By opening switch 27, the electrical connection between direct-current power supply unit 12 and the first and second metal electrode layers 8a and 8b is cut.

A desired amount of potential difference can be produced between n emitter region 3 connected to the second metal electrode layer 8b and p base region 2 connected to the first metal electrode layer $B_a$ by electrically connecting direct-current power supply unit 12 and the first and second metal electrode layers 8a and 8b by closing switch 27 as above. In this case, a potential difference is applied to a pn junction between n emitter region 3 and p base region 2 such that the potential difference is smaller than the built-in voltage of the pn junction.

Application of forward bias smaller than the built-in voltage to the pn junction between n emitter region 3 and p base region 2 becomes possible during the IGBT is conductive. Accordingly, the potential of p base region 2 can be increased and injection of electrons from n emitter region 3 into p base region 2 can be promoted. Further, by increasing the potential of p base region 2, increase of the potential at a pn junction between n drift region 1 and p base region 2 becomes possible. Injection of holes from p collector region 10 through n drift region 1 to p base region 2 can be promoted. As a result, carrier concentration in n drift region 1 and p base region 2 can be increased and resistance of the IGBT when the IGBT is conductive can be decreased. Accordingly, the ON voltage of the IGBT can be decreased and the power loss generated in the ON state of the IGBT can also be decreased. Further, by setting the voltage applied to the pn junction between p base region 2 and n emitter region 3 at a value smaller than the built-in voltage of the pn junction, the latch-up can be effectively avoided. By using direct-current power supply unit 12, the voltage applied to the pn junction can be maintained at a value smaller than the built-in voltage. As a result, the power loss in the ON state of the IGBT can be decreased, while the latch-up is effectively controlled.

Characteristics of the first embodiment which enables latch-up to be avoided without fail are hereinafter described. As shown in FIG. 1, a gate control circuit 26 is connected to gate electrode 6 and a switch control circuit 28 for controlling switch 27 is connected to gate control circuit 26. Gate control circuit 26 has a function of applying a prescribed voltage to gate electrode 6 for controlling ON/OFF of the IGBT. Specifically, gate control circuit 26 is a circuit which applies, a first voltage of at least the threshold voltage of an MOS transistor constituted of gate electrode 6, n emitter region 3 and n drift region 1, as well as a second voltage smaller than the first voltage, to gate electrode 6.

Switch control circuit 28 is a circuit for controlling operation of switch 27. Examples of switch 27 are a bipolar transistor, an MOSFET or the like. By using these semiconductor switches, high speed switching can be achieved.

Figure 4:
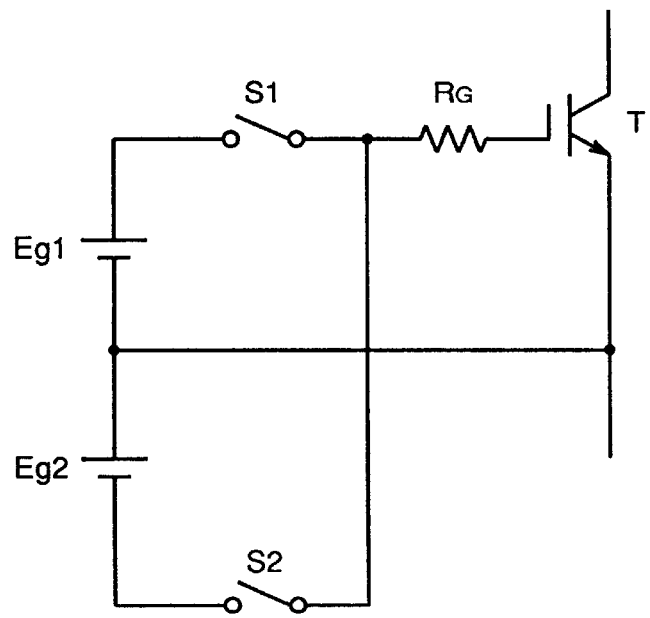
FIG. 4 is a circuit diagram showing one example of a circuit which can be used as a gate control circuit or a switch control circuit.

Referring to FIG. 4, descriptions of gate control circuit 26 and switch control circuit 28 are given. FIG. 4 shows one example of a circuit which can be used as gate control circuit 26 or switch control circuit 28.

With reference to FIG. 4, two switches S1 and S2 and two direct-current power supplies Eg1 and Eg2 are connected to an element T via a resistor $R_G$. In order to bring element T into ON state, switch S1 is closed (ON state of switch S1), and positive voltage of at least the threshold voltage is applied to the gate of element T. In order to bring element T into OFF state, switch S1 is opened (OFF state of switch S1), and switch S2 is closed. Accordingly, negative voltage is applied to the gate of element T to bring element T into OFF state. By employing such a circuit, the first voltage and the second voltage can be respectively applied to gate electrode 6. By replacing element T with switch 27, the circuit shown in FIG. 4 can be used as switch control circuit 28.

Figure 5:
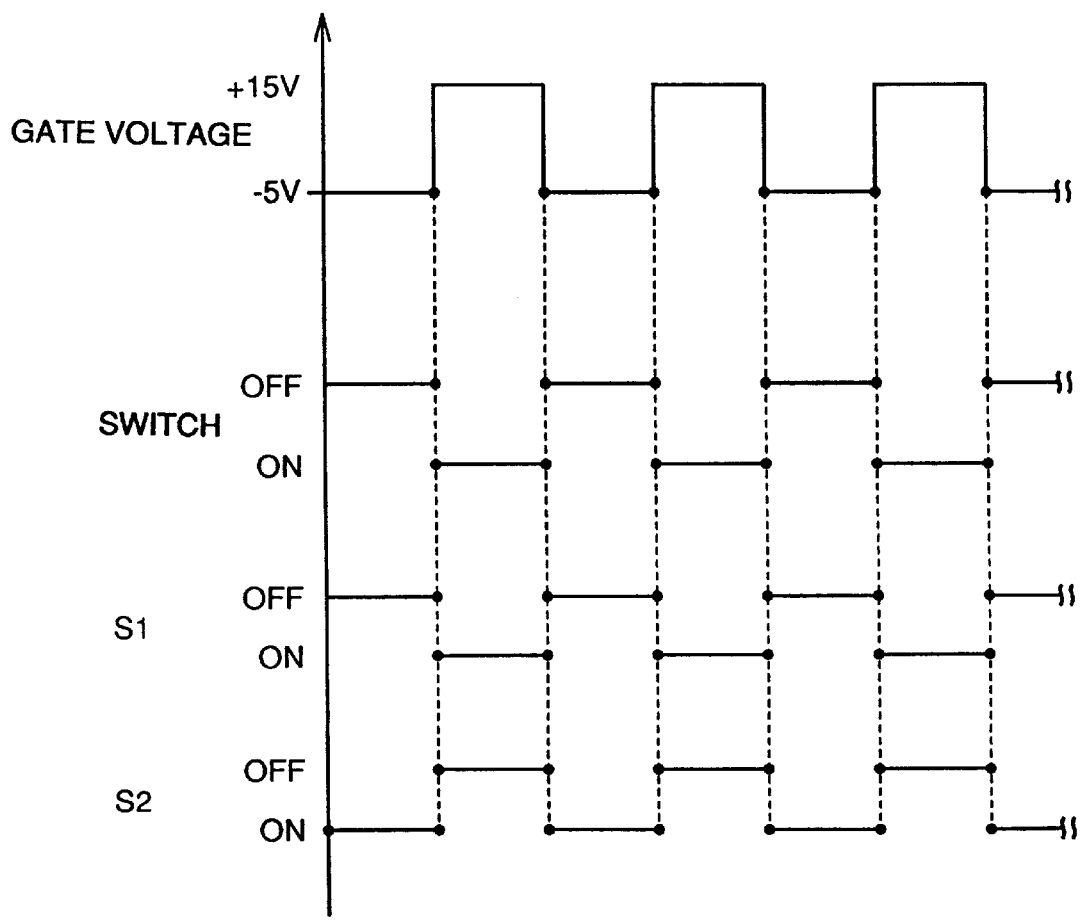
FIG. 5 shows a relation between waveform of voltage applied to the gate electrode and a switching operation by a switch.
Figure 6:
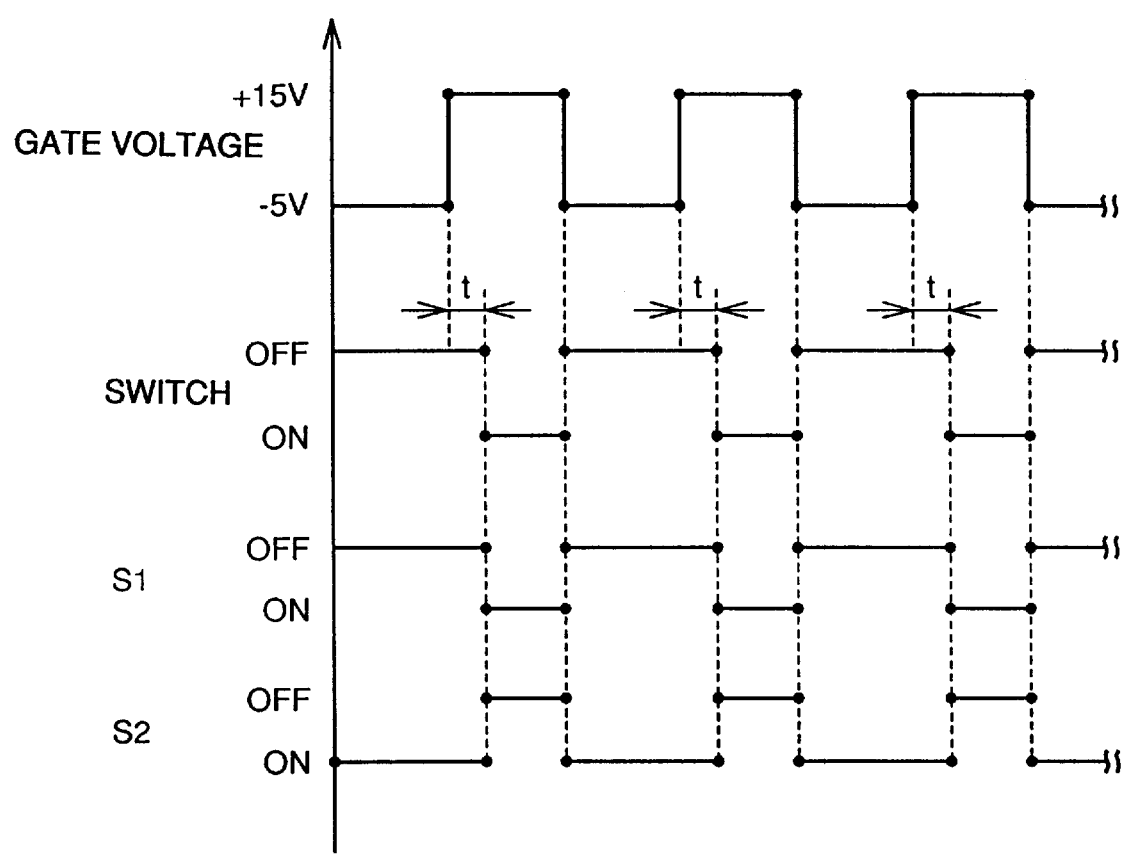
FIG. 6 shows another example of a relation between waveform of voltage applied to the gate electrode and a switching operation of the switch.

Referring to FIGS. 5 and 6, a method of controlling switch 27 is described. FIGS. 5 and 6 each shows a relation between a waveform of voltage applied to gate electrode 6 and switching operation of switch 27.

Referring to FIG. 5, voltage of −5 V is applied to gate electrode 6 to bring switch S1 into OFF state and bring switch S2 into ON state. Accordingly, the IGBT is brought into OFF state and connection between direct-current power supply 12 and the first and second metal electrode layers 8a and 8b is cut. In order to bring the IGBT into ON state, voltage of +15 V is applied to gate electrode 6. Synchronously with the application of the voltage, switch S1 is brought into ON state, and switch S2 is brought into OFF state. Accordingly, switch 27 is brought into ON state. As a result, direct-current power supply 12 can be connected to the first and second metal electrode layers 8a and 8b according to transition of the IGBT to ON state.

By controlling operation of switch 27 according to the value of the voltage applied to gate electrode 6, forward bias can be applied to the pn junction between n emitter region 3 and p base region 2 in response to transition of the IGBT to ON state to avoid application of forward bias to the pn junction when the IGBT is in OFF state. Latch-up can thus be avoided more effectively.

In FIG. 6, in order to bring switch 27 into ON state after transition of the IGBT to ON state, switch 27 is brought into ON state with delay of time t from the time when voltage of +15 V is applied to gate electrode 6. Since latch-up often occurs during transition of the IGBT to ON state, the timing of transition of switch 27 to ON state is delayed by time t for more effectively avoiding latch-up.

Figure 3:
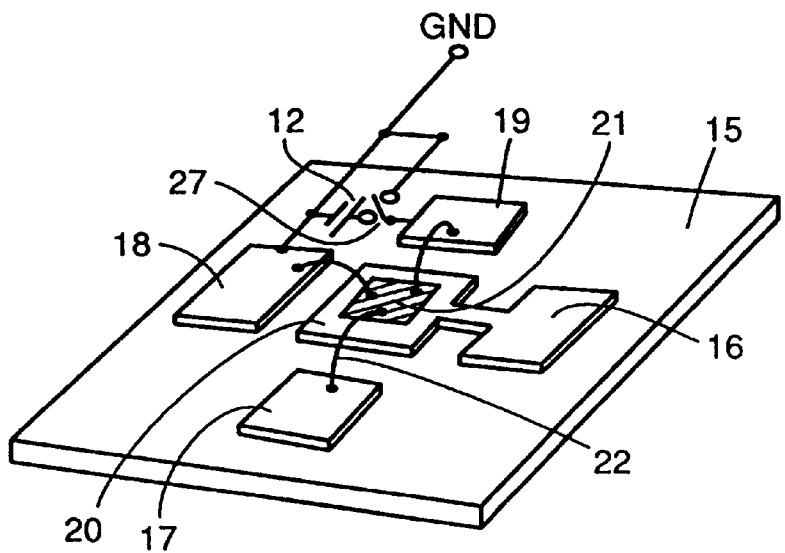
FIG. 3 is a perspective view showing one example of a specific method of providing a direct-current power supply unit and a switch according to the invention.

A specific method of placing direct-current power supply unit 12 and switch 27 is described using FIG. 3. FIG. 3 is a perspective view showing one example of the method of placing direct-current power supply unit 12 and switch 27.

Referring to FIG. 3, metal electrode plates 16, 17, 18, 19 and 20 are respectively attached onto a dielectric substrate 15 formed of ceramics or the like. Metal electrode plate 20 and metal electrode plate 16 are electrically connected, and an IGBT 21 is joined to metal electrode plate 20 with the third metal electrode layer 11a facing downward. Accordingly, metal electrode plate 16 is electrically connected to p collector region 10 of IGBT 21. Metal electrode plate 17 is electrically connected to gate electrode 6 of IGBT 21 via a bonding wire 22. Metal electrode plate 19 is electrically connected to the first metal electrode layer 8a via bonding wire 22. Metal electrode plate 18 is connected to the second metal electrode layer 8b via bonding wire 22. Direct-current power supply unit 12 is provided on dielectric substrate 15 to be electrically connected to metal electrode plates 18 and 19 respectively via switch 27.

Referring to FIGS. 7–13, a method of fabricating the n channel IGBT having the planar gate structure shown in FIG. 1 is described. FIGS. 7–13 respectively show the first to the seventh steps of a fabrication process of the n channel IGBT having the planar gate structure.

Figure 7:
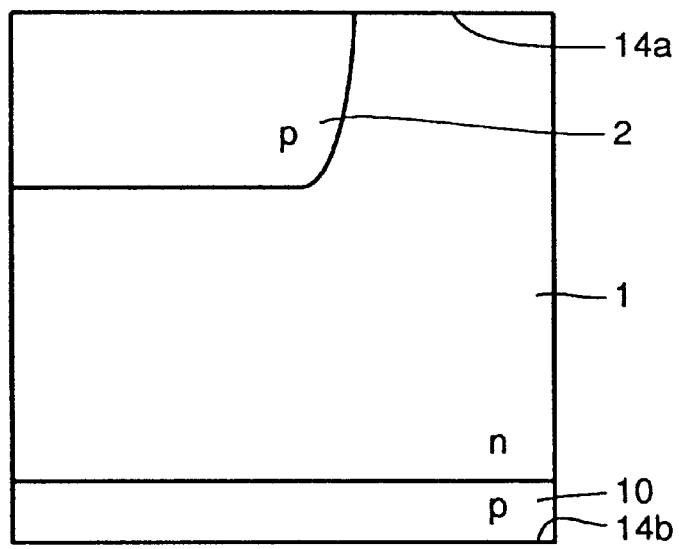
FIGS. 7–13 are cross sectional views respectively showing the first to the seventh steps of a fabrication process of the IGBT shown in FIG. 1.
Figure 8:
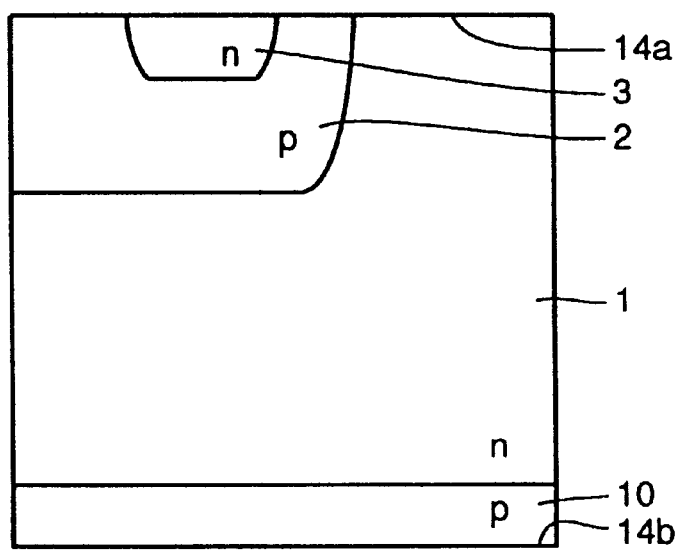

With reference to FIGS. 7 and 8, n drift region 1, p base region 2, and n emitter region 3 are respectively formed on the side of the first major surface 14a of semiconductor substrate 14, and p collector region 10 is formed on the side of the second major surface 14b of semiconductor substrate 14 using ion implantation and thermal diffusion methods.

Figure 9:
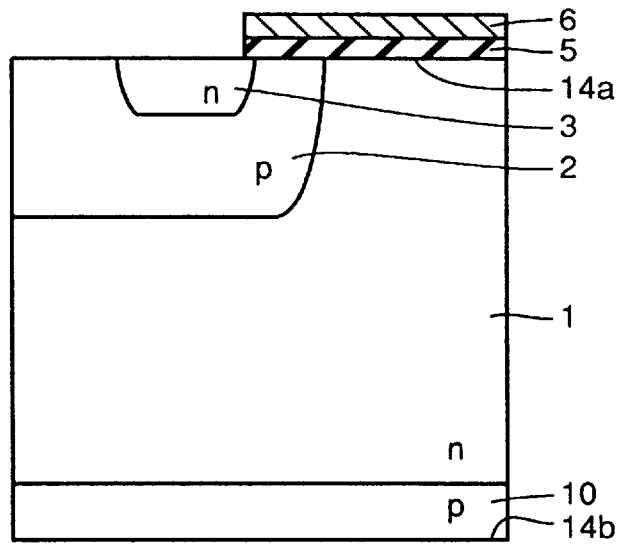

Referring to FIG. 9, a dielectric layer is formed on the first major surface 14a using thermal oxidation method or the like. The dielectric layer is formed to extend over both of n drift region 1 and n emitter region 3. A polysilicon layer doped with phosphorus is deposited on the dielectric layer using CVD (Chemical Vapor Deposition) method or the like. By patterning the polysilicon layer and the dielectric layer, gate dielectric layer 5 and gate electrode 6 are formed.

Figure 10:
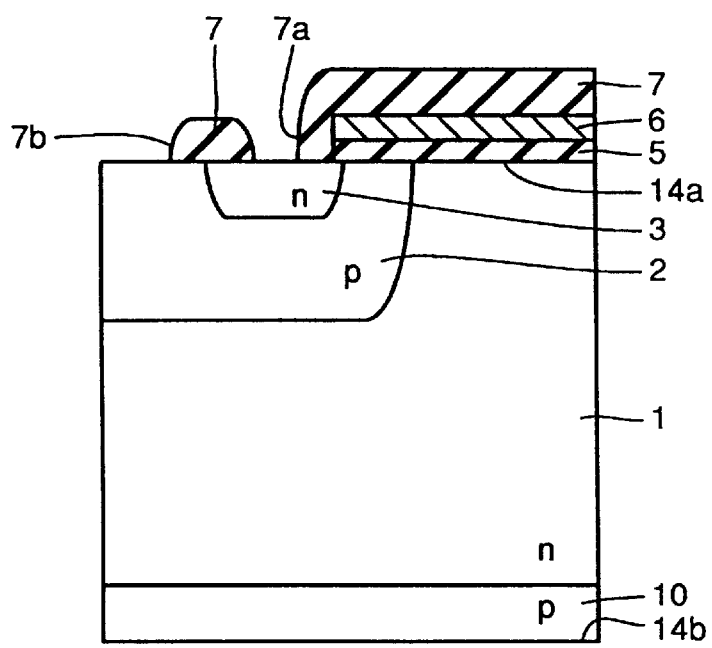

Referring to FIG. 10, a dielectric layer 7 is formed on the first major surface 14a to cover gate electrode 6 using the CVD method or the like. By etching dielectric layer 7, contact hole 7a which exposes at least a part of the surface of n emitter region 3 as well as contact hole 7b which exposes a part of the surface of p base region 2 are respectively formed. At this time, an opening for providing a conductive layer electrically connected to gate electrode 6 may be formed at dielectric layer 7.

Figure 11:
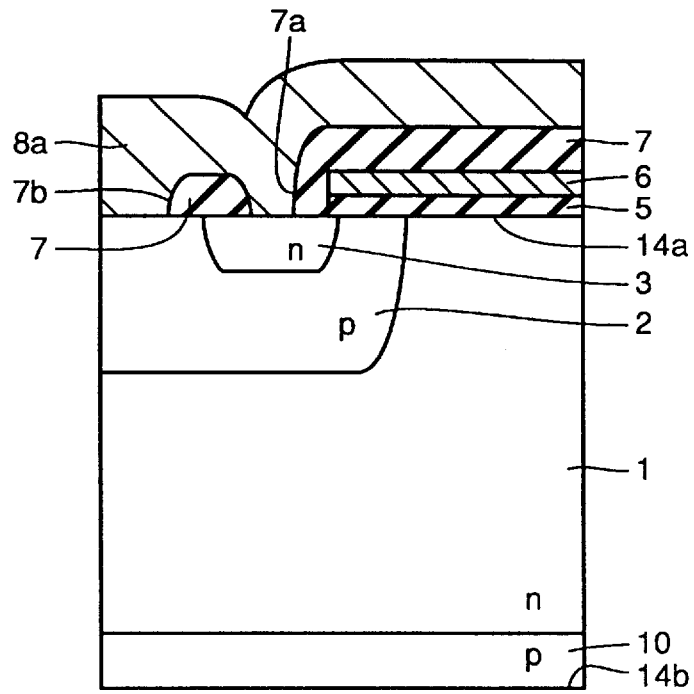
Figure 12:
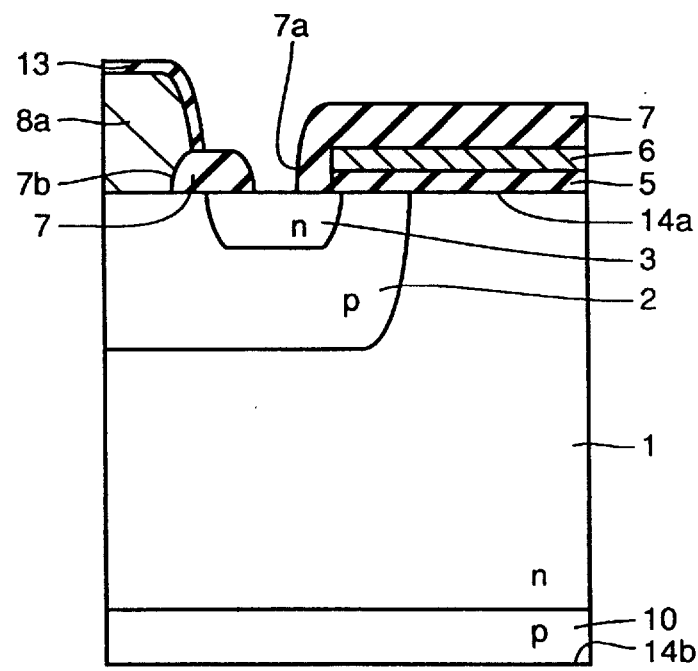
Figure 13:
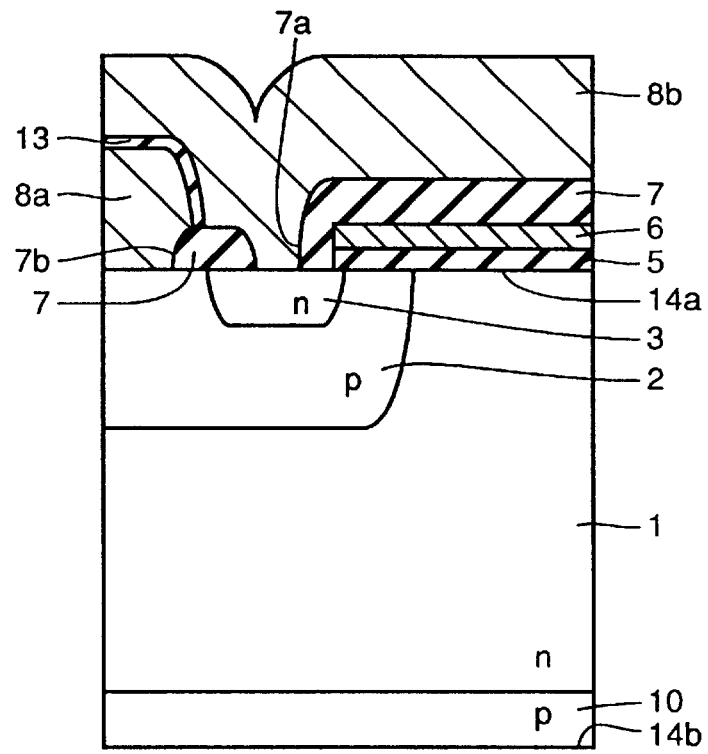

Referring to FIG. 11, the first metal electrode layer 8a is formed to extend from the inside of contact hole 7b onto dielectric layer 7. Referring to FIG. 12, after the first metal electrode layer 8a is selectively-etched to be patterned, interlayer dielectric layer 13 is formed. Interlayer dielectric layer 13 is selectively etched to be patterned. At least a part of the surface of n emitter region 3 is thus exposed. Referring to FIG. 13, the second metal electrode layer 8b is formed to extend from the inside of contact hole 7a onto interlayer dielectric layer 13. The second metal electrode layer 8b is patterned in a direction perpendicular to the major surface, and the first and the second metal electrode layers 8a and 8b are formed independently of each other.

Next the third metal electrode layer 11a is formed on the second major surface 14b to be in ohmic contact with the surface of p collector region 10. Direct-current power supply unit 12, switch 27, gate control circuit 26 and switch control circuit 28 that are electrically connected to the first and the second metal electrode layers 8a and 8b are provided. The IGBT having the planar gate structure shown in FIG. 1 is thus completed through the processes above.

Figure 2:
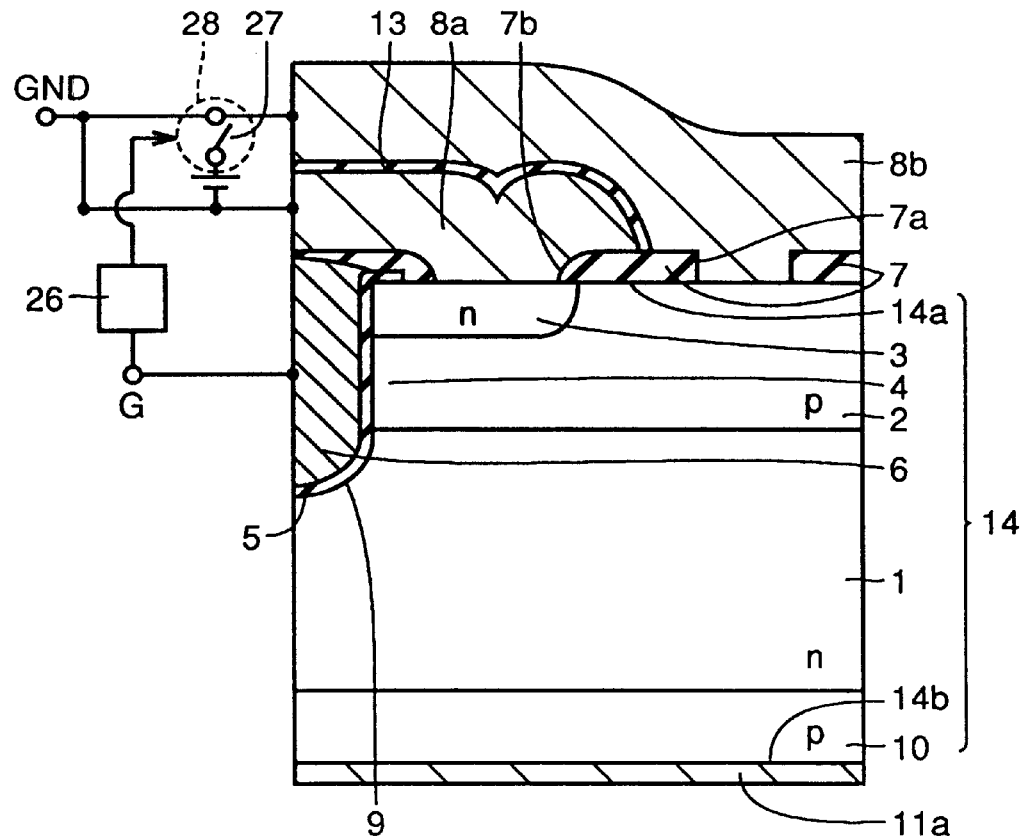
FIG. 2 shows a cross section of a modification of the IGBT shown in FIG. 1.

Referring to FIG. 2, a modification of the first embodiment above is described. FIG. 2 is a cross sectional view showing an IGBT according to the modification of the first embodiment.

Referring to FIG. 2, the concept of the present invention is applied to an IGBT having the trench gate structure to provide the modification. As shown in FIG. 2, a trench 9 is formed from the first major surface 14a to penetrate through n emitter region 3 and p base region 2 and reach n drift region 1. A region in p base region 2 which is adjacent to the sidewall of trench 9 becomes channel formation region 4.

Gate electrode 6 is buried in trench 9 via gate dielectric layer 5. Dielectric layer 7 is formed to cover gate electrode 6. The configuration other than that described above is almost similar to that of the IGBT shown in FIG. 1 and description thereof is omitted.

In order to fabricate the vertical type n channel IGBT having the trench gate structure shown in FIG. 2, the method of fabricating the planar gate type IGBT above may be modified a little. Specifically, trench 9 may be formed before formation of gate dielectric layer 5 and gate electrode 6, and gate dielectric layer 5 and gate electrode 6 may be buried in trench 9. Processes other than this process are almost similar to those for the planar gate type IGBT above.

Second Embodiment

Figure 14:
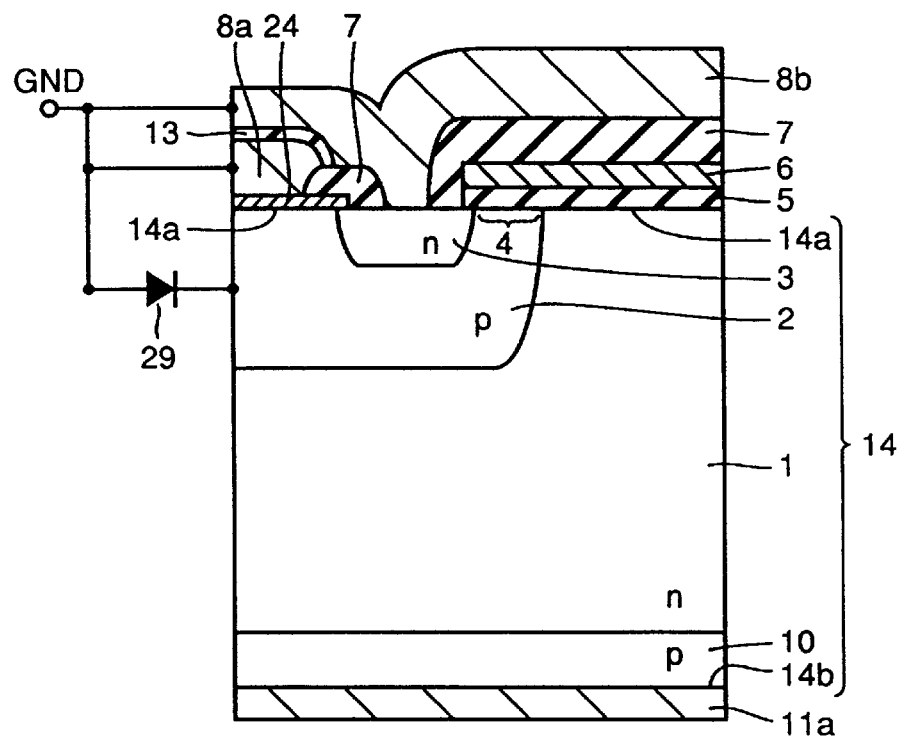
FIG. 14 is a cross sectional view of an IGBT according to the second embodiment of the invention.

Referring to FIGS. 14–20, the second embodiment and modifications thereof are described. FIG. 14 is a cross sectional view showing an IGBT according to the second embodiment of the invention.

According to the second embodiment, means for dropping voltage is employed as forward bias means, and a Zener diode 29 is provided in parallel with the voltage drop means. In the case shown in FIG. 14, a resistive layer 24 is provided as the voltage drop means. Resistive layer 24 is formed on the surface of p base region 2, and is formed of non-doped polysilicon or polysilicon doped with phosphorus of low concentration, for example. The resistance of resistive layer 24 is preferably set at a value higher than the value of sheet resistance of p base region 2. The structure other than above is almost similar to that shown in FIG. 1.

Provision of resistive layer 24 as voltage drop means causes voltage drop when current passes through resistive layer 24 during conduction of the IGBT. The potential of p base region 2 can be increased to be higher than that of n emitter region 3, and forward bias can thus be applied to the pn junction between p base region 2 and n emitter region 3. As a result, injection of electrons from n emitter region 3 into p base region 2 can be promoted. Further, injection of holes into p base region 2 can be promoted, and the carrier concentration in n drift region 1 and p base region 2 can be increased. Accordingly, resistance of the IGBT during conduction can be decreased, and ON voltage of the IGBT can be decreased.

Specifically, if current with current density of 100 A/cm$^2$ flows in a cell of its size 5 $\mu$m×5 $\mu$m, for example, ON voltage can be improved by at most approximately 0.17 V by setting the resistance value of resistive layer 24 at about 2×10$^3$($\Omega$)–about 2×10$^5$($\Omega$).

The reason thereof is hereinafter described. Current of 2.5×10$^{-5}$ A obtained according to the following equation (1) flows in the cell above.

$$100 \times (5 \times 10^{-4}) \times (5 \times 10^{-4}) = 2.5 \times 10^{-5} (A) \quad (1)$$

If the maximum amount of voltage drop is 0.5 V, resistance value R can be obtained according to the equation (2) below.

$$R = \frac{0.5}{2.5} \times 10^5 = 2 \times 10^4 \; (\Omega) \quad (2)$$

The hole current in ON state is one third of the electron current, and ON voltage can be improved by a value obtained according to the following equation (3).

$$2.5 \times 10^{-5} \times 2 \times 10^4 \times \frac{1}{3} = 0.17 \; (V) \quad (3)$$

ON voltage of about 0.17 V can be reduced accordingly. Preferably, the amount of voltage drop generated by resistive layer 24 is adjusted to be smaller than built-in voltage of the pn junction between p base region 2 and n emitter region 3. By providing resistive layer 24, voltage applied to the pn junction can be made smaller than the built-in voltage and latch-up can be avoided. Further, by providing Zener diode 29 having withstand voltage of 0.5 V or less, voltage applied to the pn junction can be prevented from exceeding the built-in voltage by the voltage drop above. As a result, the latch-up can be more effectively avoided.

Figure 20:
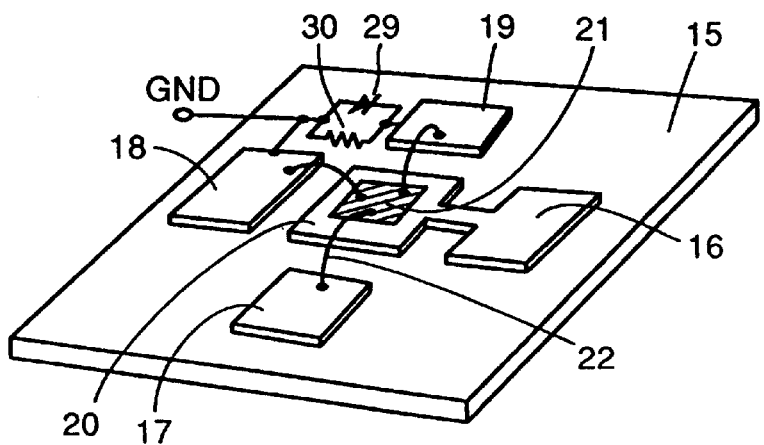
FIG. 20 is a perspective view showing one example of a specific method of providing the voltage drop means and the Zener diode according to the invention.
Figure 21:
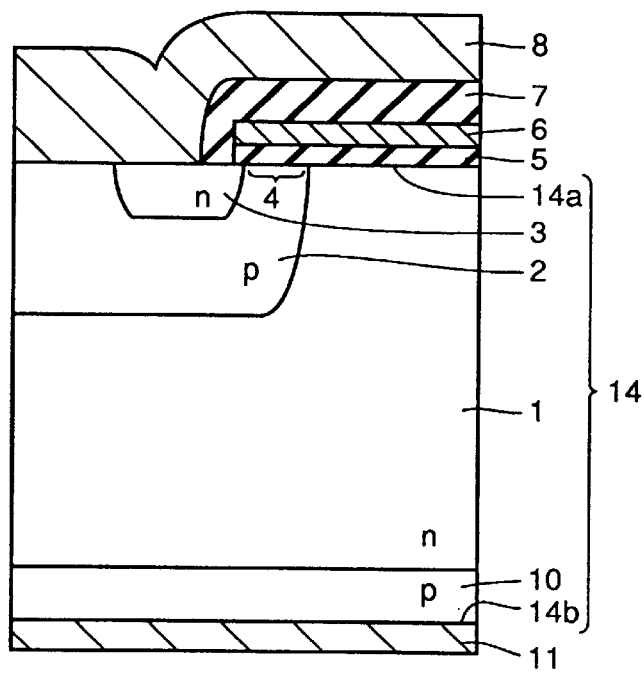
FIG. 21 is a cross sectional view showing one example of a conventional n channel IGBT.
Figure 22:
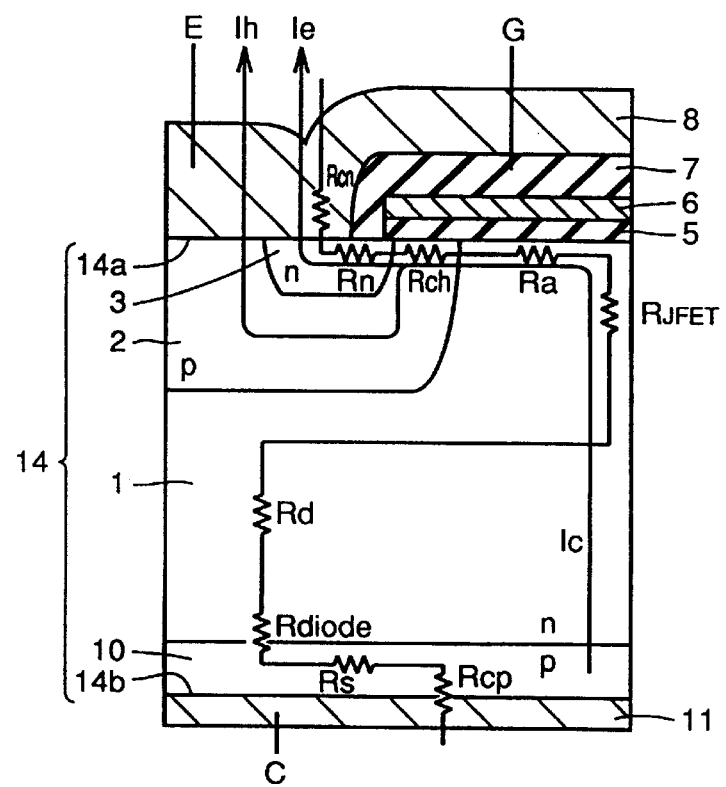
FIG. 22 shows a current path of the IGBT shown in FIG. 21.
Figure 23:
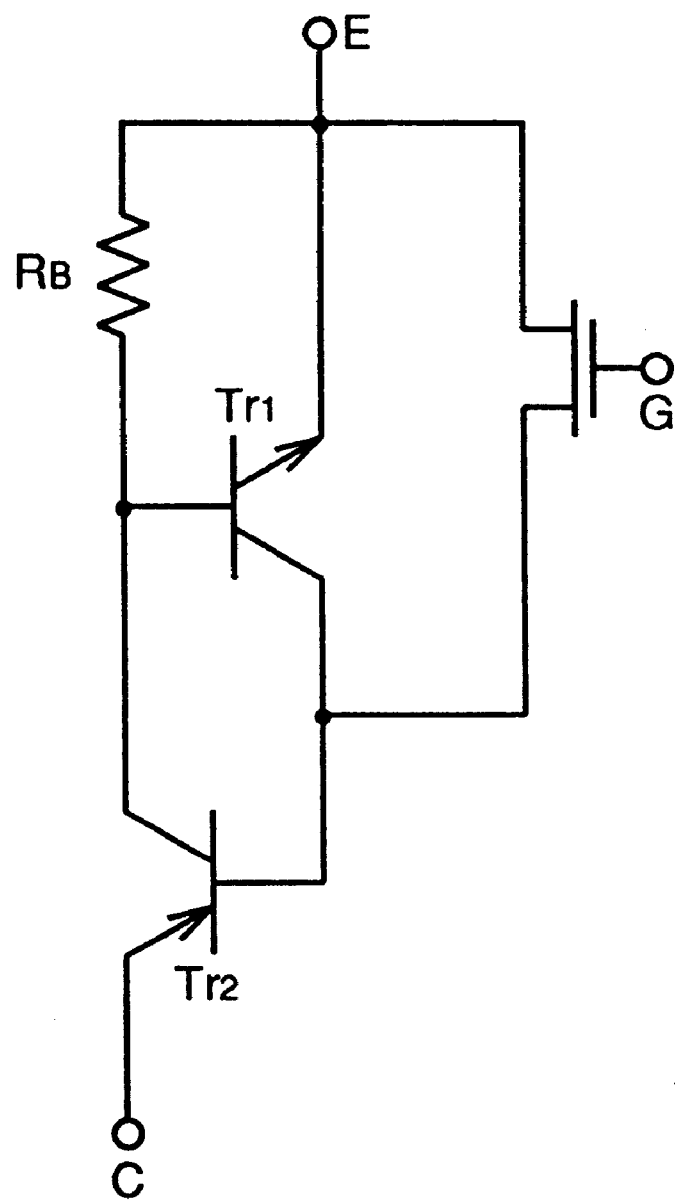
FIG. 23 shows an equivalent circuit to the IGBT provided for describing the latch-up.

A specific method of placing voltage drop means 30 and Zener diode 29 is described using FIG. 20. FIG. 20 is a perspective view showing one example of the method of placing voltage drop means 30 and Zener diode 29.

With reference to FIG. 20, a resistor as voltage drop means 30 and Zener diode 29 are connected in parallel with each other between metal electrode plates 18 and 19. Other configurations are similar to those shown in FIG. 3 and description thereof is omitted. The concept shown in FIG. 20 can be similarly applied to each modification described below.

Figure 15:
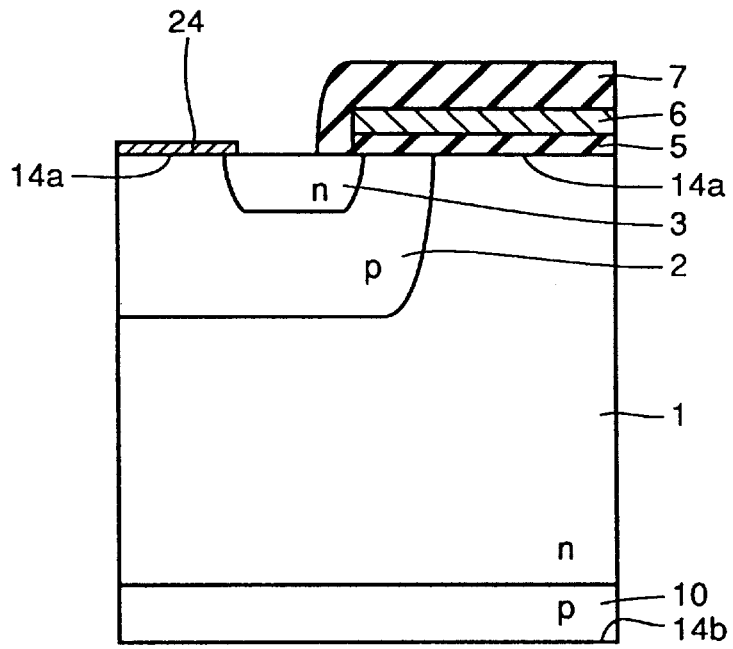
FIG. 15 is a cross sectional view showing a characteristic process of manufacturing the IGBT shown in FIG. 14.

A method of fabricating the IGBT shown in FIG. 14 is described using FIG. 15. FIG. 15 is a cross sectional view showing a characteristic process of fabricating the IGBT of FIG. 14.

Referring to FIG. 15, gate electrode 6 is formed after the processes similar to those according to the first embodiment are finished. Dielectric layer 7 is formed by a method similar to that according to the first embodiment, and dielectric layer 7 is patterned to a prescribed shape. The whole surface of p base region 2 which is not covered with gate electrode 6 is exposed.

After depositing a polysilicon layer doped with phosphorus on the first major surface 14a using the CVD or the like, the polysilicon layer is patterned to a prescribed shape. Accordingly, resistive layer 24 is formed to extend from the portion above p base region 2 onto a part of the surface of n emitter region 3. Metal electrode layer 8a is thereafter formed to cover resistive layer 24 and n emitter region 3. The IGBT shown in FIG. 14 is thereafter completed through processes similar to those according to the first embodiment.

Figure 16:
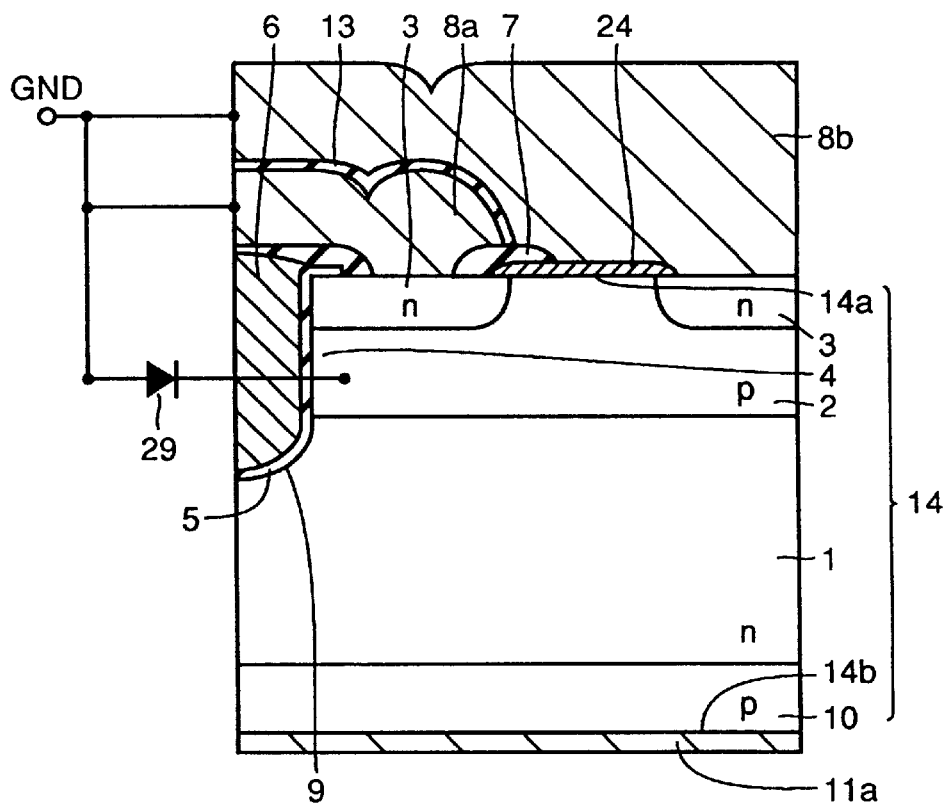
FIGS. 16 and 17 are cross sectional views respectively showing the first and the second modifications of the IGBT shown in FIG. 14.

An IGBT according to the first modification of the second embodiment is described using FIG. 16. FIG. 16 is a cross sectional view showing the IGBT according to the first modification.

In this modification, the concept of the second embodiment is applied to the n channel IGBT of the trench gate type. In this case, an effect similar to that obtained in the case shown in FIG. 14 could be expected. The methods of fabricating the IGBT according to the first and second embodiments may be combined to obtain a method of fabricating the IGBT according to the first modification.

Figure 17:
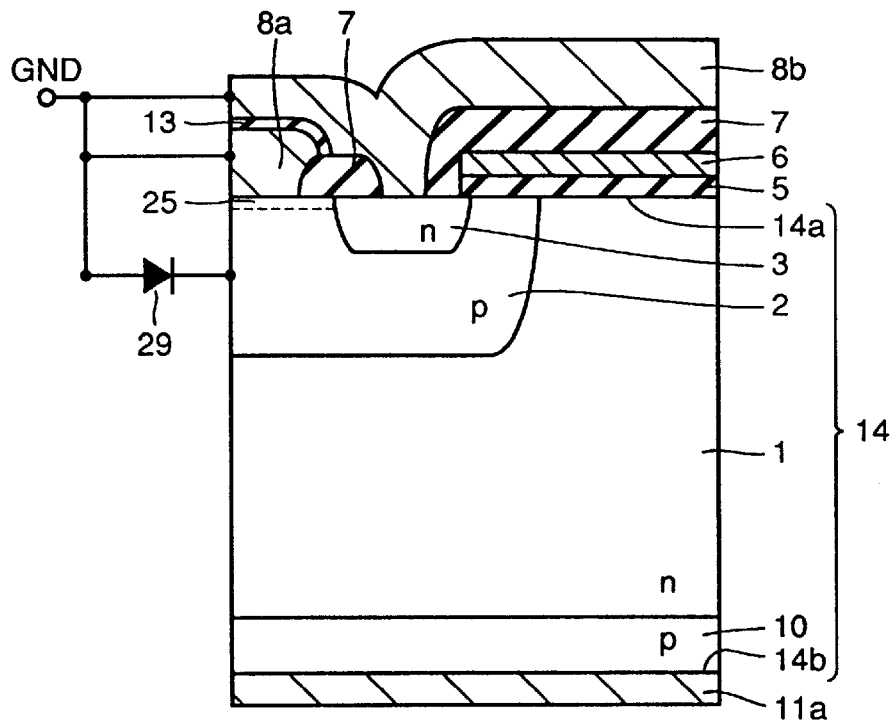

The second modification of the second embodiment is described below using FIG. 17. FIG. 17 is a cross sectional view showing the second modification of the second embodiment.

With reference to FIG. 17, a Schottky junction region 25 is provided as the voltage drop means in the second modification. Schottky junction region 25 is formed at the surface of p base region 2 and can be formed, for example, by setting the concentration of impurities in p base region 2 at the contact portion with metal electrode layer 8a at a low value. Since n emitter region 3 contains n type impurities of high concentration (e.g. 10$^{19}$cm$^{-3}$ or more), n emitter region 3 can be in ohmic contact with metal electrode layer 8b. However, by setting the concentration of p type impurities at a portion where p base region 2 is in contact with metal electrode layer 8a at a low value, an energy barrier can be generated at a portion where the first metal electrode layer 8a is in contact with p base region 2. As a result, the Schottky junction between p base region 2 and the first metal electrode layer 8a can be provided.

Any material which produces an energy barrier to an n type impurity region sufficiently lower than an energy barrier to a p type impurity region may be selected as material for the first and second metal electrode layers 8a and 8b. Accordingly, the energy barrier between p base region 2 and the first metal electrode layer 8a can be made higher than the energy barrier between the second electrode layer 8b and n emitter region 3, and Schottky junction region 25 can be formed similarly to the case described above.

Further, different materials may be used for the electrodes respectively for n emitter region 3 and p base region 2. Specifically, materials for the first and second metal electrode layers 8a and 8b may be different from each other. In this case, a material producing an energy barrier to n emitter region 3 which is as low as possible is selected as a material for the second metal electrode layer 8b, and a material producing an energy barrier to p base region 2 higher than that produced by the second metal electrode layer 8b is employed as a material for the first metal electrode layer 8a. Schottky junction region 25 can thus be produced. Those concepts described above may be combined appropriately.

By providing Schottky junction region 25, voltage drop can be caused in Schottky junction region 25 as in the case according to the second embodiment, and ON voltage of the IGBT can be reduced. Preferably, the potential difference between p base region 2 and n emitter region 3 due to presence of Schottky junction region 25 is smaller than the built-in voltage of the pn junction between p base region 2 and n emitter region 3 in this modification. The latch-up can thus be prevented.

Figure 18:
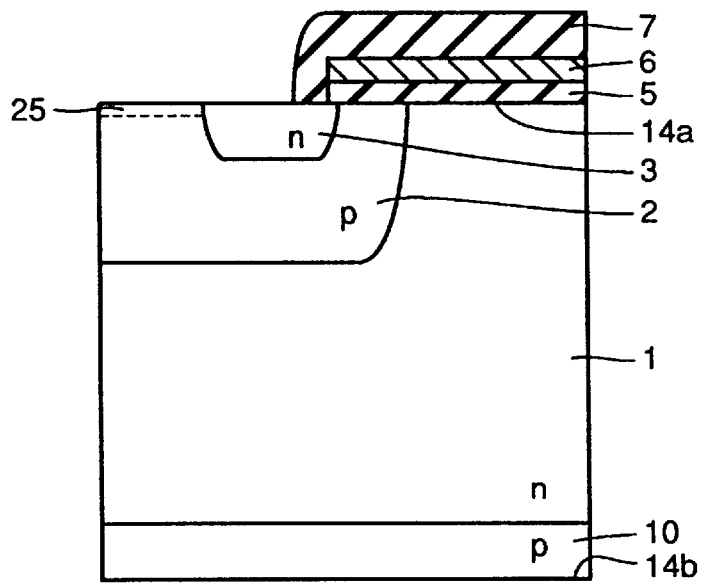
FIG. 18 is a cross sectional view showing a characteristic process of manufacturing the IGBT shown in FIG. 17.

A method of fabricating the IGBT according to the second modification above is described using FIG. 18.

FIG. 18 is a cross sectional view showing a characteristic process of fabricating the IGBT according to the second modification.

Referring to FIG. 18, dielectric layer 7 is formed after the processes similar to those according to the second embodiment are finished. Schottky junction region 25 is formed at the surface of p base region 2. Schottky junction region 25 can be formed, for example, by controlling the concentration of the surface of p base region 2 to set the concentration of p type impurities contained in the surface of p base region 2 at a low value. Specifically, an amount of doping of p type impurities for the contact with the first metal electrode layer 8a is controlled or the doping is omitted. The IGBT shown in FIG. 17 is thereafter completed through the processes similar to those according to the second embodiment.

Figure 19:
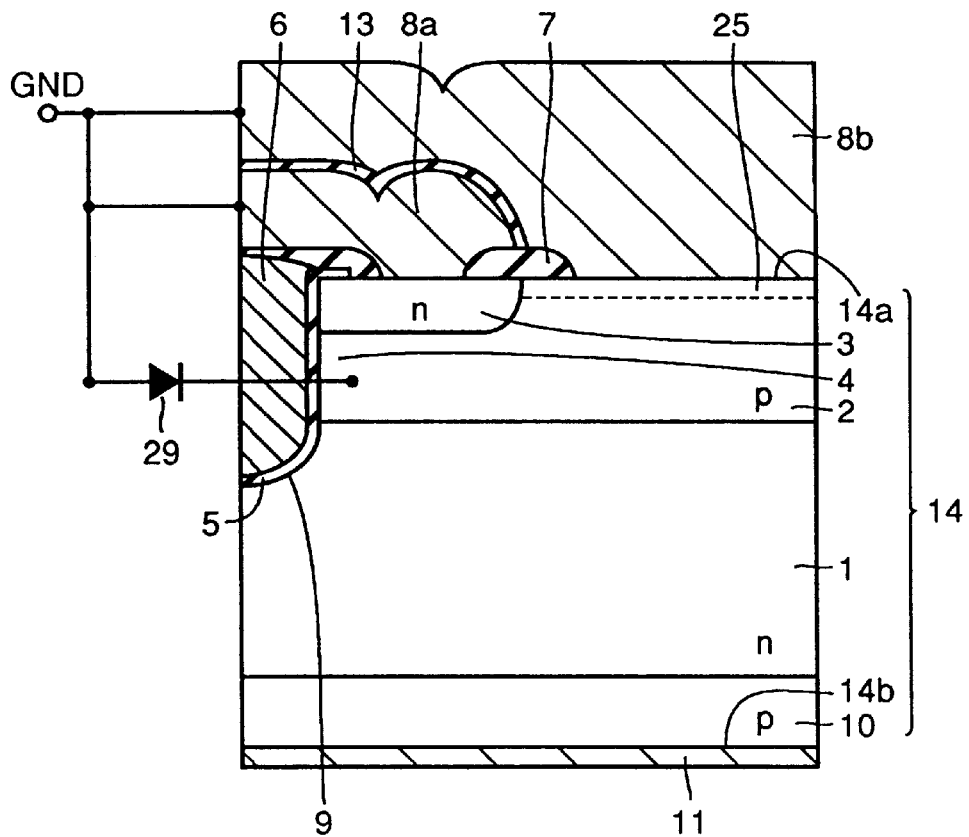
FIG. 19 is a cross sectional view showing the third modification of the IGBT shown in FIG. 14.

The third modification of the second embodiment is described below using FIG. 19. FIG. 19 is a cross sectional view showing an IGBT according to the third modification.

Referring to FIG. 19, the IGBT of the third modification is obtained by applying the concept of the second modification shown in FIG. 17 to an IGBT having the trench gate structure. In this case, an effect similar to that obtained in the second modification can be achieved. A method of fabrication according to the third modification can be easily devised by combining the methods of fabrication according to the second embodiment and the first modification, and description thereof is omitted.

The present invention is applicable to a device in which the n type and the p type in each embodiment are replaced with each other. Further, characteristics of respective embodiments or their modifications can be combined appropriately.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having first and second major surfaces opposite to each other and conducting/cutting off current flowing between said first and second major surfaces, comprising:

a semiconductor substrate having said first and second major surfaces;

a first impurity region of a first conductivity type formed to extend from said first major surface into said semiconductor substrate;

a second impurity region of a second conductivity type selectively formed in said first impurity region;

a third impurity region of the first conductivity type selectively formed in said second impurity region;

a channel formation region located in said second impurity region and at which a channel is formed;

a gate dielectric layer formed along said channel formation region;

a gate electrode which is opposed to said channel formation region with said gate dielectric layer therebetween;

a first electrode layer formed on said first major surface to be electrically connected to said second impurity region;

a second electrode layer formed on said first major surface to be electrically connected to said third impurity region;

forward bias means for applying forward bias to a pn junction between said second and third impurity regions;

forward bias control means connected to said forward bias means for controlling a value of voltage applied to said pn junction by said forward bias means;

a fourth impurity region of the second conductivity type formed to extend from said second major surface into said semiconductor substrate; and a third electrode layer formed on said second major surface to be electrically connected to said fourth impurity region.

2. The semiconductor device according to claim 1, wherein the voltage applied to the pn junction between said second and third impurity regions by said forward bias means is smaller than built-in voltage of said pn junction.

3. The semiconductor device according to claim 1, wherein said forward bias means includes a direct-current power supply connected to said first and second electrode layers when said semiconductor device is conductive, said forward bias control means includes a switch provided between said forward bias means and said first or second electrode layer, and said switch is opened or closed according to a value of voltage applied to said gate electrode.

4. The semiconductor device according to claim 3, wherein a first voltage and a second voltage are applied to said gate electrode, said channel is formed by applying said first voltage, and said channel disappears by applying said second voltage, said switch is closed according to application of said first voltage and said forward bias is applied to said pn junction, and said switch is opened according to application of said second voltage and application of said forward bias is stopped.

5. The semiconductor device according to claim 3, wherein said switch is a semiconductor switch.

6. The semiconductor device according to claim 1, wherein said first and second electrode layers are constituted of metal formed to be in ohmic contact with surfaces of said second and third impurity regions respectively, and a dielectric layer is formed between said first and second electrode layers to extend from a portion above said first major surface.

7. The semiconductor device according to claim 1, wherein said forward bias means includes voltage drop means sandwiched between said first electrode layer and said second impurity region, and said forward bias control means includes a Zener diode connected in parallel with said forward bias means.

8. The semiconductor device according to claim 7, wherein withstand voltage of said Zener diode is 0.5 V or less.

9. The semiconductor device according to claim 7, wherein said voltage drop means includes a resistive layer having a resistance value higher than a sheet resistance value of said second impurity region.

10. The semiconductor device according to claim 7, wherein said voltage drop means includes a Schottky junction.

* * * * *